US008653662B2

(12) United States Patent
LaCroix et al.

(10) Patent No.: US 8,653,662 B2
(45) Date of Patent: Feb. 18, 2014

(54) STRUCTURE FOR MONITORING STRESS INDUCED FAILURES IN INTERLEVEL DIELECTRIC LAYERS OF SOLDER BUMP INTEGRATED CIRCUITS (75) Inventors: Luke D. LaCroix, Williston, VT (US); Mark Lamorey, South Burlington, VT (US); Janak G. Patel, South Burlington, VT (US); Peter Slota, Jr., Vestal, NY (US); David B. Stone, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/461,912

(22) Filed: May 2, 2012

(65) Prior Publication Data

US 2013/0292817 A1 Nov. 7, 2013

(51) Int. Cl.
*H01L 23/48* (2006.01)
*H01L 23/52* (2006.01)
*H01L 29/40* (2006.01)
*H01L 23/053* (2006.01)
*H01L 23/12* (2006.01)

(52) U.S. Cl.
USPC ........... 257/738; 257/700; 257/758; 257/780; 257/E23.021

(58) Field of Classification Search
USPC ................... 257/700, 738, 758, 780, E23.021
See application file for complete search history.

(56) References Cited

U.S. PATENT DOCUMENTS

| | | | |
|---|---|---|---|
| 6,114,181 A | 9/2000 | Gregoritsch, Jr. | |
| 6,365,975 B1 * | 4/2002 | DiStefano et al. | 257/777 |
| 6,680,529 B2 * | 1/2004 | Chen et al. | 257/700 |
| 6,707,124 B2 * | 3/2004 | Wachtler et al. | 257/433 |
| 6,722,031 B2 * | 4/2004 | Japp et al. | 29/852 |
| 6,818,544 B2 * | 11/2004 | Eichelberger et al. | 438/613 |
| 6,841,873 B2 * | 1/2005 | Yoshida et al. | 257/738 |
| 6,953,999 B2 * | 10/2005 | Strandberg et al. | 257/778 |
| 7,217,999 B1 * | 5/2007 | Honda | 257/712 |
| 7,476,555 B2 | 1/2009 | Tsay et al. | |
| 7,622,309 B2 | 11/2009 | Su et al. | |
| 7,622,737 B2 * | 11/2009 | Farooq et al. | 257/48 |
| 7,642,649 B2 * | 1/2010 | Murtuza | 257/758 |
| 7,674,637 B2 | 3/2010 | Carey et al. | |

(Continued)

OTHER PUBLICATIONS

Nack et al., Substrate Voltage, Bump Test for Dynamic RAM Memory Devices, Publication date: Feb. 5, 2005, Original Disclosure Information: TDB 11-84, p. 3469-3470, IP.com No. IPCOM000044197D, 3 pages.

(Continued)

*Primary Examiner* — Ida M Soward
(74) *Attorney, Agent, or Firm* — Schmeiser, Olsen & Watts LLP; David A. Cain (57) ABSTRACT A structure and method for monitoring interlevel dielectric stress damage. The structure includes a monitor solder bump and normal solder bumps; a set of stacked interlevel dielectric layers between the substrate and the monitor solder bump and the normal solder bumps, one or more ultra-low K dielectric layers comprising an ultra-low K material having a dielectric constant of 2.4 or less; a monitor structure in a region directly under the monitor solder bump in the ultra-low K dielectric layers and wherein the conductor density in at least one ultra-low K dielectric layer in the region directly under the monitor solder bumps is less than a specified minimum density and the conductor density in corresponding regions of the ultra-low K dielectric layers directly under normal solder bumps is greater than the specified minimum density.

19 Claims, 12 Drawing Sheets

(56) References Cited

U.S. PATENT DOCUMENTS

| | | | |
|---|---|---|---|
| 7,727,781 B2 | 6/2010 | Antol et al. | |
| 7,772,703 B2* | 8/2010 | Cheng | 257/758 |
| 7,830,004 B2* | 11/2010 | Wu | 257/729 |
| 8,004,085 B2* | 8/2011 | Yamamichi et al. | 257/758 |
| 8,169,076 B2* | 5/2012 | Lii et al. | 257/737 |
| 8,237,274 B1* | 8/2012 | Rahman | 257/737 |
| 8,269,337 B2* | 9/2012 | Hu et al. | 257/700 |
| 8,288,875 B2* | 10/2012 | Shimizu et al. | 257/784 |
| 8,373,276 B2* | 2/2013 | Mori et al. | 257/774 |
| 8,441,131 B2* | 5/2013 | Ryan | 257/774 |
| 2004/0262727 A1* | 12/2004 | McConville et al. | 257/678 |
| 2010/0200992 A1* | 8/2010 | Purushothaman et al. | 257/758 |
| 2011/0084390 A1* | 4/2011 | Chen | 257/738 |

OTHER PUBLICATIONS

Method for a C4 bump shear metrology to quantitatively evaluate the solder-joint fracture strength of individual first-level interconnections in electronic packages, Publication date: Jul. 11, 2006, IP.com No. IPCOM000138234D, 4 pages.

Wafer Level Wettability Test, Publication date: Mar. 2, 2011, IP.com No. IPCOM000204536D, 3 pages.

He et al., Test Vehicle to Characterize Silicon to Organic Flip Chip Package Thermomechancial Interactions, 2004 Electronic Components and Technology Conference, pp. 712-717.

\* cited by examiner

STRUCTURE FOR MONITORING STRESS INDUCED FAILURES IN INTERLEVEL DIELECTRIC LAYERS OF SOLDER BUMP INTEGRATED CIRCUITS

FIELD OF THE INVENTION

The present invention relates to the field of integrated circuits; more specifically, it relates to a structure for monitoring stress induced failures in the wiring levels of integrated circuits under solder bump connections.

BACKGROUND

During conventional flip chip to module mounting, stress induced by the coefficient of thermal expansion (CTE) mismatch between the chip and the module may be transmitted through the solder bump structure into the chip causing in damage in the wiring levels of the chip directly under the solder bumps and ultimately resulting in chip/module failures. Accordingly, there exists a need in the art for a structure and method to monitor the occurrence of such failures.

SUMMARY

A first aspect of the present invention is an integrated circuit, comprising: an integrated circuit chip comprising a semiconductor substrate and an array of solder bumps, the array of solder bumps comprising a monitor solder bump and normal solder bumps; a stack of interlevel dielectric layers between the substrate and the array of solder bumps; one or more ultra-low K layers of the interlevel dielectric layers, each of the one or more ultra-low K layers comprising an ultra-low K material having a dielectric constant of 2.4 or less; a monitor structure in a region directly under the monitor solder bump, the monitor structure comprising conductors embedded the one or more ultra-low K layers, the monitor structure extending vertically through the one or more ultra-low K layers; and wherein the conductor density in at least one ultra-low K layer of the one or more ultra-low K layers in the region directly under the monitor solder bumps is less than a specified minimum density and the conductor density in corresponding regions of each layer of the one or more ultra-low K layers directly under each normal solder bump of a plurality of the normal solder bumps is greater than a specified minimum density.

A second aspect of the present invention is a method, comprising: forming an integrated circuit chip comprising a semiconductor substrate and an array of solder bumps, the array of solder bumps comprising a monitor solder bump and normal solder bumps; forming stack of interlevel dielectric layers between the substrate and the array of solder bumps, one or more of the interlevel dielectric layers being an ultra-low K layer comprising an ultra-low K material having a dielectric constant of 2.4 or less; forming a monitor structure in a region directly under the monitor solder bump, the monitor structure comprising wires embedded in each of the one or more ultra-low K layers, the monitor structure extending vertically through the one or more ultra-low K layers; and wherein the conductor density in the one or more ultra-low K layer in the region directly under the monitor solder bumps is less than a specified minimum density and the conductor density in corresponding regions of the one or more ultra-low K layers directly under each normal solder bump of a plurality of the normal solder bumps is greater than the specified minimum density These and other aspects of the invention are described below.

BRIEF DESCRIPTION OF THE DRAWINGS

The features of the invention are set forth in the appended claims. The invention itself, however, will be best understood by reference to the following detailed description of illustrative embodiments when read in conjunction with the accompanying drawings, wherein:

DETAILED DESCRIPTION

Figure 3:
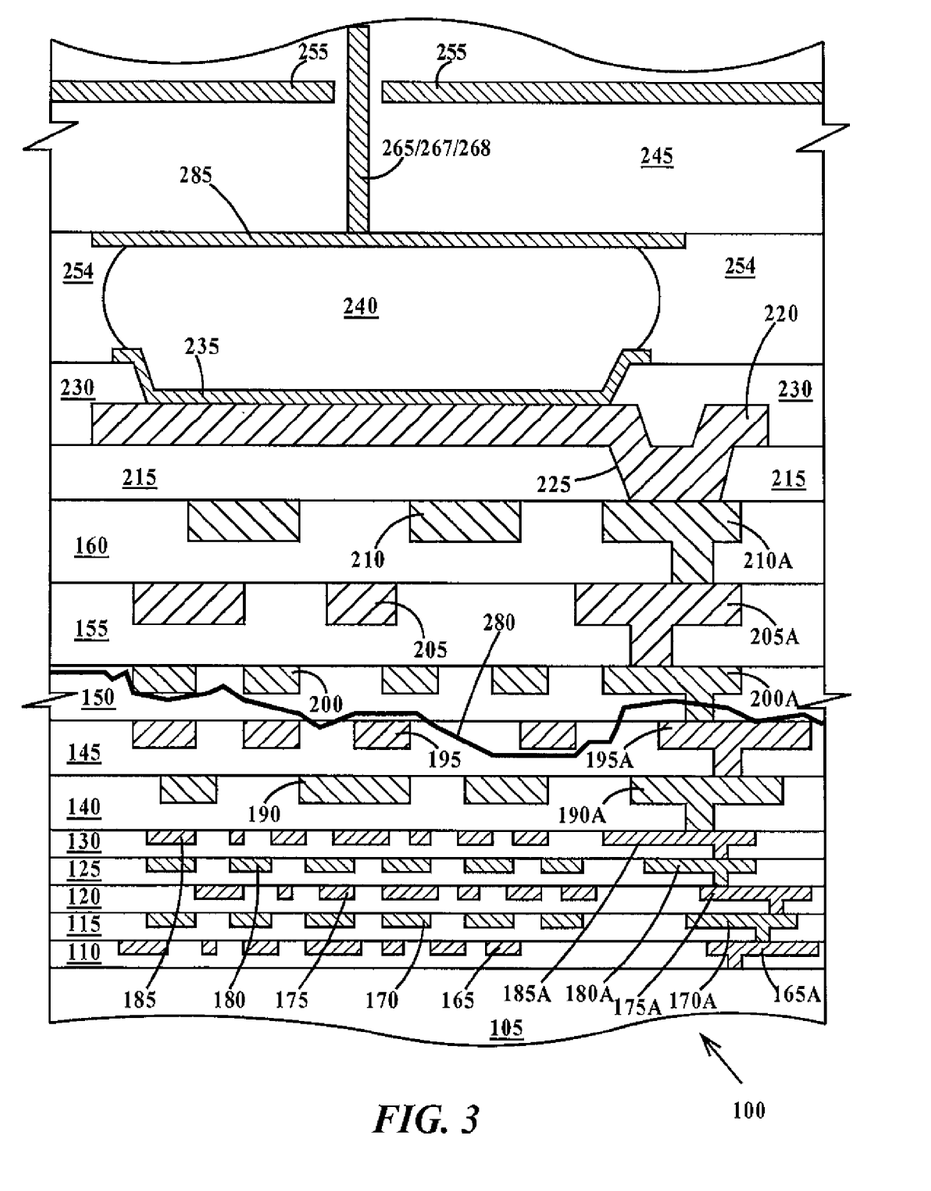
FIG. 3 is a cross section view the integrated circuit of FIG. 1, mounted to an exemplary module illustrating a stress induced separation failure.
Figure 6:
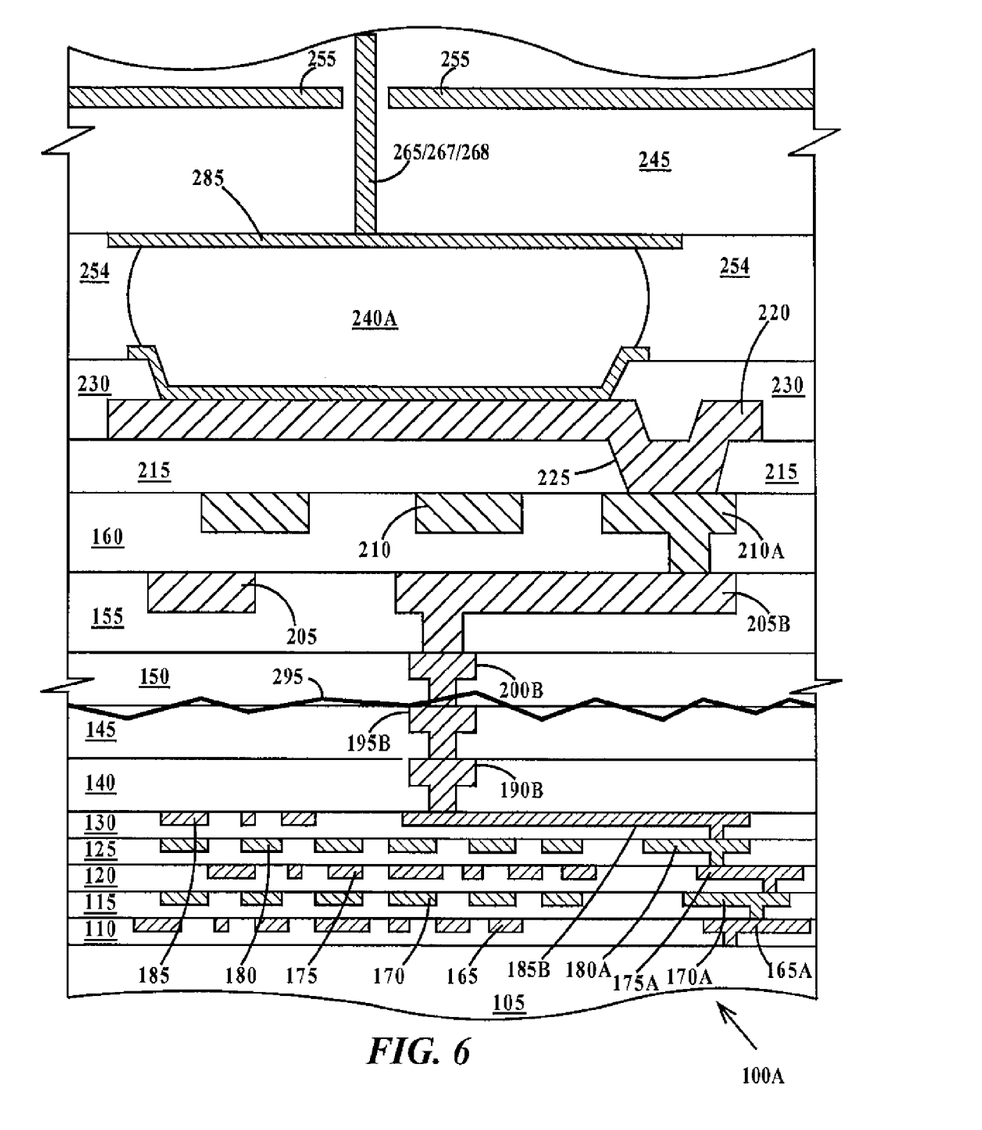
FIG. 6 is a cross section view of the integrated circuit of FIG. 4, mounted to an exemplary module illustrating a stress induced separation failure.
Figure 7:
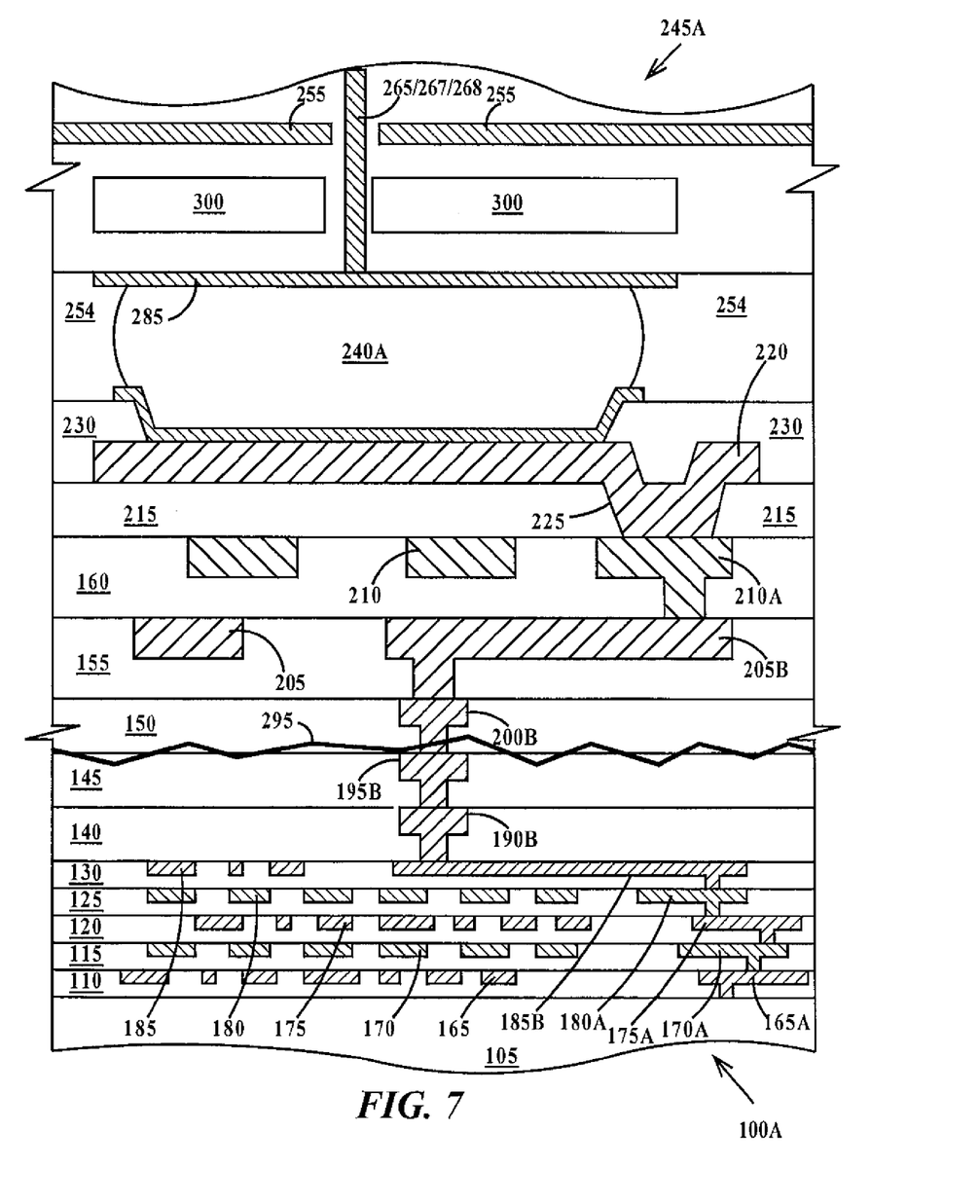
FIG. 7 is a cross section view the integrated circuit of FIG. 4, mounted to an exemplary stress inducing module illustrating a stress induced separation failure.

Ultra-low K (ULK) dielectric materials are used in the interlevel dielectric layer (ILD) of specified wiring levels under solder bumps of integrated circuit chips to minimize capacitive coupling of the wires. However, ULK materials also have a low Young's modulus of elasticity making them structurally weak. Structural failure including cracking and delamination of ULK layers can occur because of mismatch between the coefficients of expansion between the integrated circuit chip and the module or package to which the chip is solder bump attached. A crack is defined as a separation within a layer, while a delamination is defined as a separation between two layers at the layer interface. A separation may include regions of cracks in combination with regions of delamination. In the examples of FIGS. 3, 6 and 7 a single separation is illustrated. However, it should be understood that when the ULK ILD fails there may be a different combinations of separations such as multiple cracks, multiple delaminations and combinations of cracks and delaminations and that entire sections of the ILD layers and solder bump above the separations may break away from the chip.

Separations in the ULK ILD layers under solder bumps manifest themselves as "white bumps" because they appear white as opposed to black in the tests (e.g., high frequency acoustic micro imaging) conventionally used to detect ILD failures. Embodiments of the present invention allow monitoring chip/module packages by placing monitor structures in weak (e.g., low modulus) regions of ULK ILD under selected solder bumps. The weak regions are weakened by reducing the density of electrical conductors (i.e., wires and fill shapes, defined infra) in the region.

A monitor solder bump is a solder bump that has a monitor structure according to the embodiments of the present invention present in specified wiring levels under the solder bump. A normal solder bump is a solder bump that does not have a monitor structure according to the embodiments of the present invention present in specified wiring levels directly under the solder bump. Normal solder bumps may be connected to ground, VDD or I/O (input/output; e.g., data or control) nets of the integrated circuit chip. Ground and VDD are designations of the negative and positive terminals of a direct current (DC) power supply. Monitor solder bumps may be connected to ground, VDD or I/O nets of the integrated circuit chip. In one example, monitor solder bumps are connected only to ground or VDD nets and not connected to I/O nets. In one example, monitor solder bumps are connected to functional circuits of the integrated circuit chip. In one example, monitor solder bumps are connected only to the monitor structure and are not connected to the functional circuits of the integrated circuit chip. In one example, monitor solder bumps are not connected to the test structure underneath and not connected to functional circuits of the integrated circuit chip. The ULK region under a monitor solder bumps is intentionally made weaker than a corresponding ULK regions under normal solder bumps by limiting the conductor density under the monitor solder bump. The ULK regions under a monitor solder bumps is made weaker relative to the corresponding ULK regions under normal solder bumps by reducing the conductor density. Solder bumps are also known as C4s, where C4 stands for controlled-chip-collapse-connection.

Figure 1:
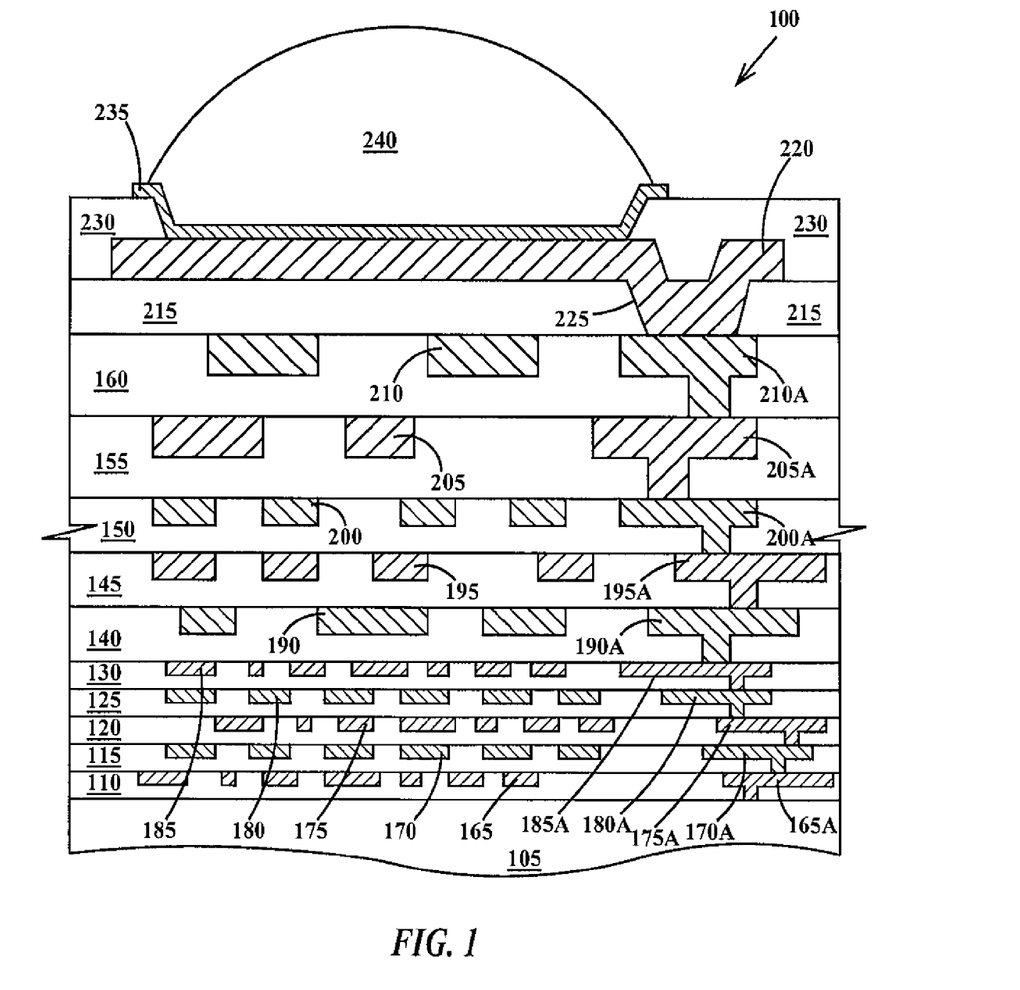
FIG. 1 is an exemplary cross section view of the wiring levels of an integrated circuit chip under a normal solder bump.

FIG. 1 is an exemplary cross section view of the wiring levels of an integrated circuit chip under a normal solder bump. In FIG. 1, an integrated circuit 100 includes a semiconductor substrate 105 and an ILD layer 110 on substrate 105, an ILD layer 115 on ILD layer 110, an ILD layer 120 on ILD layer 115, an ILD layer 125 on ILD layer 120, an ILD layer 130 on ILD layer 125, an ULK ILD layer 140 on ILD layer 130, and ULK ILD layer 145 on ULK ILD layer 140, an ULK ILD layer 150 on ULK ILD layer 145, an ILD layer 155 on ULK ILD layer 150, and an layer ILD 160 on ILD layer 155. Formed in ILD layer 110 are damascene or dual damascene wires 165 and 165A. Formed in ILD layer 115 are damascene or dual damascene wires 170 and 170A. Formed in ILD layer 120 are damascene or dual damascene wires 175 and 175A. Formed in ILD layer 125 are damascene or dual damascene wires 180 and 180A. Formed in ILD layer 130 are damascene or dual damascene wires 185 and 185A. Formed in ULK ILD layer 140 are damascene or dual damascene wires 190 and 190A. Formed in ULK ILD layer 145 are damascene or dual damascene wires 195 and 195A. Formed in ULK ILD layer 150 are damascene or dual damascene wires 200 and 200A. Formed in ILD 155 layer are damascene or dual damascene wires 205 and 205A. Formed in ILD layer 160 are damascene or dual damascene wires 210 and 210A. Formed on ILD layer 160 is a dielectric layer 215 and formed on dielectric layer 215 is an electrically conductive pad 220 that makes physical and electrical contact to wire 210A. A dielectric passivation layer 230 is formed over a chip pad 220 and dielectric layer 215 except for a central region of pad 230. Formed on chip pad 220 and overlapping onto passivation layer 230 is a ball limiting metallurgy (BLM) 235. A solder bump 240 is formed on BLM 235. Wires 165A, 170A, 175A, 180A, 185A, 190A, 195A, 200A and 210A illustrate how an electrical path may be established from solder bump 240 to a region of substrate 105. While three ULK ILD layers are illustrated there may be as few as two or more than three such layers stacked one on top of one another.

A damascene wire is a wire formed by a damascene process. In a damascene process wire trenches or via openings are formed in a dielectric layer, an electrical conductor of sufficient thickness to fill the trenches or via openings is deposited in the trenches and on a top surface of the dielectric layer. A chemical-mechanical-polish (CMP) process is performed to remove excess conductor and make the surface of the conductor co-planar with the surface of the dielectric layer to form the damascene wire. A dual-damascene wire is a wire formed by a dual-damascene process. A via first dual-damascene process is one in which via openings are formed through the entire thickness of a dielectric layer followed by formation of trenches part of the way through the dielectric layer in any given cross-sectional view. A trench first dual-damascene process is one in which trenches are formed part way through the thickness of the dielectric layer followed by formation of via openings inside the trenches the rest of the way through the dielectric layer in any given cross-sectional view. All via openings are intersected by integral wire trenches above and by a wire trench below, but not all trenches need intersect a via opening. An electrical conductor of sufficient thickness to fill the trenches and via openings is deposited on a top surface of the dielectric and a CMP process is performed to make the surface of the conductor in the trench co-planar with the surface of the dielectric layer to form dual-damascene wires having integral dual-damascene vias. Fill shapes are also formed by damascene processes. Fill shapes are used to increase the uniformity of the CMP process and planarity of the polished ILD layer. While a wire connects elements of functional or monitor circuits together, fill shapes are not connected to any functional or monitor circuit. In any given ILD layer, fill shapes are not connected to any wire in the ILD layer and are not connected to each other. Fill shapes in any given ILD layer are not connected to any wire in any other ILD layer. The area conductor density in any given region of ILD is the sum of the area of wires and area of fill shapes divided by the total area of the region. The volume conductor density in any given region of ILD is the sum of the volume of wires and volume of fill shapes divided by the volume of the ILD region. The term "conductor" when used hereinafter and in the claims is defined as "an electrically conductive wire or fill shape." The term "conductor density", when used hereinafter and in the claims is defined as "the area or volume density of electrically conductive wires and electrically conductive fill shapes."

Examples of low-K dielectric materials include but are not limited to hydrogen silsesquioxane polymer (HSQ), methyl silsesquioxane polymer (MSQ), (methyl doped silica or $SiO_x$ $(CH_3)_y$ or $SiC_xO_yH_y$ or SiOCH). Examples of ULK include but are not limited to porous hydrogen silsesquioxane polymer (HSQ), porous methyl silsesquioxane polymer (MSQ), porous (methyl doped silica or $SiO_x(CH_3)_y$ or $SiC_xO_yH_y$ or SiOCH), octamethylcyclotetrailoxane (OMCTS) based materials and tetrametylcyclotetrailoxane (TMCTS) based materials. The actual dielectric constant of low-k and especially ultra-low K dielectrics can depend not only on the composition of the material, but its physical structure and the method used to deposit the material. In one example, the conductive material of wires and fill shapes comprises a liner of titanium/titanium nitride (Ti/TiN) or tantalum/tantalum nitride (Ta/TaN) on the sides and bottom of a copper (Cu) core. The Ti or Ta is between the TiN or TaN and the copper core.

For the purposes of describing and claiming the present invention, a low-K dielectric material is defined as dielectric material having a relative permittivity of between about 2.4 and about 3 and an ULK dielectric material is defined as a dielectric material having a dielectric constant of about 2.4 or less preferably about 2.0 or less. In one example, the ULK dielectric materials of the embodiments of the present invention have a dielectric constant of about 2.4 or less and a modulus of elasticity of about of about 5 Giga Pascal's (GPa) or less. By way of comparison, fluoridated tetraethoxysilane (FTEOS) oxide has a dielectric constant of about 3.5 and a modulus of elasticity of about 70 GPa and copper has a modulus of elasticity of about 150 GPa.

In one example, ILD layers 110, 115, 120, 125 and 130 comprise an OMCTS. based material, ILD layers 140, 145 and 150 comprise a ULK dielectric material and ILD layers 155 and 160 comprise TEOS oxide. In one example, wires 165, 170, 175, 180, 185, 190, 200, 205 and 210 comprise an electrically conductive liner on sidewalls and a bottom surface of an electrical core conductor. In one example, the core conductor is copper and the liner comprises one or more layers of titanium, titanium nitride, tantalum and tantalum nitride. In one example, chip pad 220 comprises aluminum. In one example, passivation layer 230 comprises polyimide. In one example, BLM 235 comprises one or more layers of material selected from the group of materials consisting of chrome (Cr), copper (Cu), tungsten (W), titanium (Ti), gold (Au) and nickel (Ni). In one example, solder bump 240 comprises tin (Sn), silver (Ag), or combinations thereof.

Figure 2A:
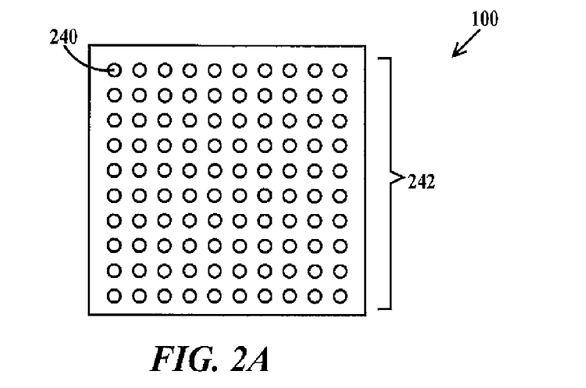
FIG. 2A is an exemplary top view of a flip chip integrated circuit chip.

FIG. 2A is an exemplary top view of a flip chip integrated circuit chip. In FIG. 2A, integrated circuit 100 has an array 242 of solder bumps 240 arranged in rows and columns. In the example of FIG. 2A the array is 10 by 10 for 100 total solder bumps. However, there may be more or less than 100 solder bumps. Also, there may not be a solder bump in every array position. One or more monitor solder bumps may be placed in any one or more of the four corner positions, any one or more of the outside row positions, any one or more of the outside column positions, any one or more of the inside row positions, any one or more of the inside column positions and combinations thereof. The preferred location(s) of the monitor bumps is in regions of the chip having the highest stress. In one example, the regions of highest stress are the corners of array 242. However, after packaging the chip, thermal warpage of the chip can move the regions of highest stress to other regions and the monitor bumps should be located in these other regions.

Figure 2B:
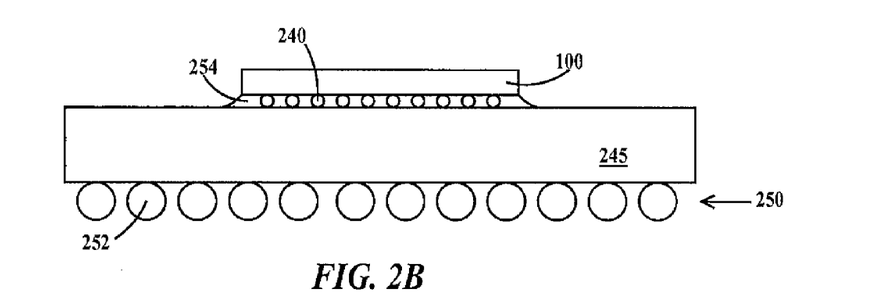
FIG. 2B is an exemplary side view of an integrated circuit chip flip chip mounted to a module.

FIG. 2B is an exemplary side view of an integrated circuit chip flip chip mounted to a module. In FIG. 2B, integrated circuit chip 100 is flip-chip mounted to a module 245. In flip-chip mounting, the solder bumps of the chip are used to solder the chip pads 230 (see FIG. 1) to module pads (not shown) on module 245 using a solder reflow process, whereby, the chip is placed on the module with the solder bumps aligned on top of respective module pads, the assembly heated to melt (reflow) the solder bumps, and then allowed to cool. Module 245 includes, by way of example, a ball grid array 250 of solder (or copper) balls 252. Optionally, a dielectric silicon oxide filled epoxy 254 may be injected between chip 100 and module 245.

Figure 2C:
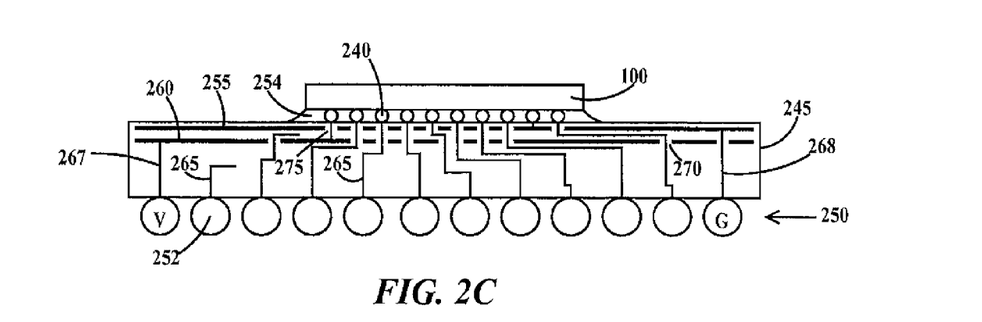
FIG. 2C is an exemplary cross-sectional view of an integrated circuit chip flip chip mounted to a module.

FIG. 2C is an exemplary cross-sectional view of an integrated circuit chip flip chip mounted to a module. In FIG. 2C, module 245 includes a ground (e.g., GND) plane 255, a power (e.g., VDD) plane 260 and I/O wires 265 electrically connecting solder or copper balls 252 to solder bumps 240. A power wire 267 connects a solder ball V to power plane 260 and a ground wire 268 connects a solder ball G to ground plane 255. Since ground plane 255 and power plane 260 are essentially sheets of metal, openings 270 are provided in power plane 260 to allow I/O wires 265 and ground wire 268 to pass through the power plane and openings 275 are provided in ground plane 255 to allow I/O wires 265 to wires connected between power plane 260 and solder bumps 240 pass through the ground plane.

FIG. 3 is a cross section view the integrated circuit of FIG. 1, mounted to an exemplary module illustrating a stress induced separation failure. FIG. 3 is similar to FIG. 1 except chip 100 has been mounted to module 245. Module 245 includes a module pad 285 connected to an I/O wire 265 (or alternatively to a power wire 267 or a ground wire 268) and ground plane 255. Optional silicon oxide filled epoxy 254 is also illustrated. Because of the thermal coefficient of expansion mismatch between module 245 and chip 100 a separation 280 has been formed in ULK ILD layers 145 and 150 after cool down from the solder reflow process. This has disrupted the connection between wire 195A and 200A yielding either an open circuit or a high resistance circuit.

Figure 4:
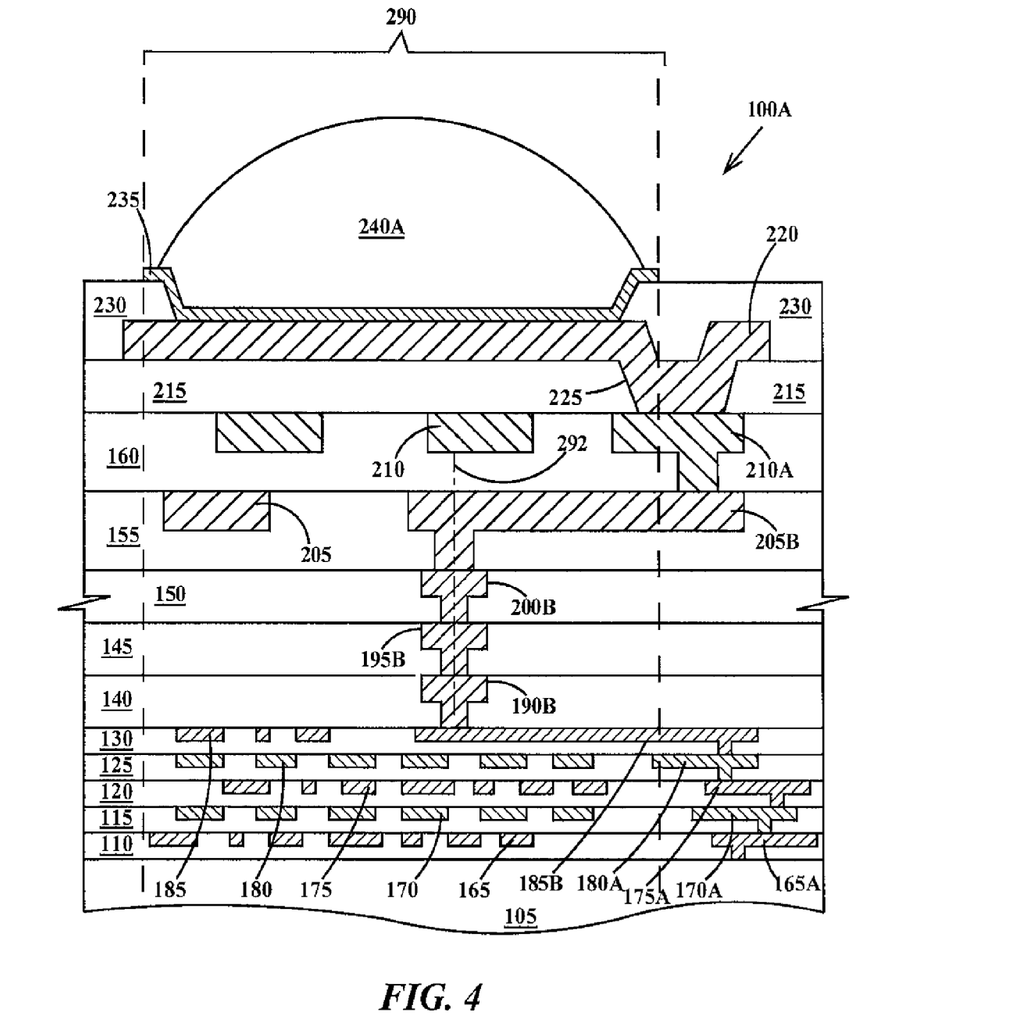
FIG. 4 is an exemplary cross section view of the wiring levels of an integrated circuit chip under a monitor solder bump illustrating a monitor structure according to an embodiment of the present invention.

FIG. 4 is an exemplary cross section view of the wiring levels of an integrated circuit chip under a monitor solder bump illustrating a monitor structure according to an embodiment of the present invention. FIG. 4 is similar to FIG. 1, except the wiring in ILD layers 130 and 155 and in ULK ILD layers 140, 145 and 150 have been modified in a region 290 under a solder bump 240A to form a monitor structure comprising wires 190B, 195B and 200B connected to wires 185B and 205B. There is thus formed an electrical connection between solder bump 240A and devices (e.g., transistors) formed in substrate 105 that passes through region 290. Solder bump 240A is designated a monitor solder bump because of (i) the presence of the monitor structure comprising wires 190B, 195B and 200B in region 290 and (ii) because the lower conductor density in at least one of ULK ILD layers 140, 145 and 150 compared to the conductor density in those same layers under a normal solder bump in a region similar to region 290. In the example of FIG. 4, portions of the monitor structure are formed through all ULK ILD layers. However, the monitor structure may be formed in less than all the ULK ILD layers. For example, the connection between wires 205B and 200B may be moved outside of region 290. Likewise the connection between wires 185B and 190B may be moved outside of region 290.

If the horizontal direction is defined as parallel to the top surface of substrate 105, then the vertical direction can be defined as a direction perpendicular to the top surface of substrate 105. Thus, the monitor structure 190B/195B/200B extends in the vertical direction along an axis 292. A vertical extension of the monitor structure is advantageous because separations extend principally in the horizontal direction and the monitor structure will be disposed to damage from those separations (see FIG. 6).

Figure 5A:
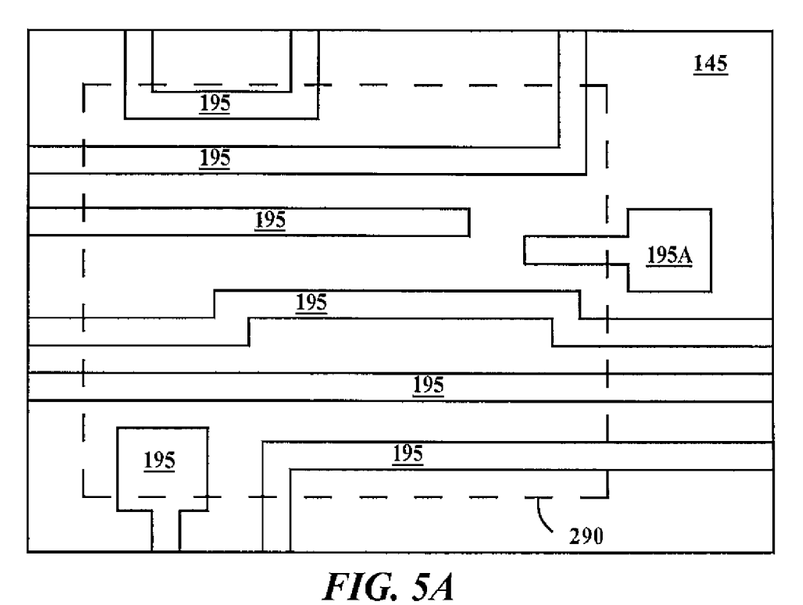
FIG. 5A is an exemplary plan view of a wiring level under a normal solder bump.

FIG. 5A is an exemplary plan view of a wiring level under a normal solder bump. A plan view is defined as a view of the top surface of a wiring level; the top surface being the surface away from substrate 105. In FIG. 5A, ULK ILD layer 145 of FIG. 1 is illustrated by way of example. It can be seen that six wires 195 pass through a normal region 290 and portions of two other wires are within region 290. In FIG. 5A, the conductor density in region 290 is about 38% though FIG. 5A is not in scale and region 290 has at least 10 times the area shown but would be filled with at least 10 times as many wires 195 as shown. Also, wires 195 that pass through region 290 strengthen the ULK material much as glass fibers in resin strengthen fiberglass.

Figure 5B:
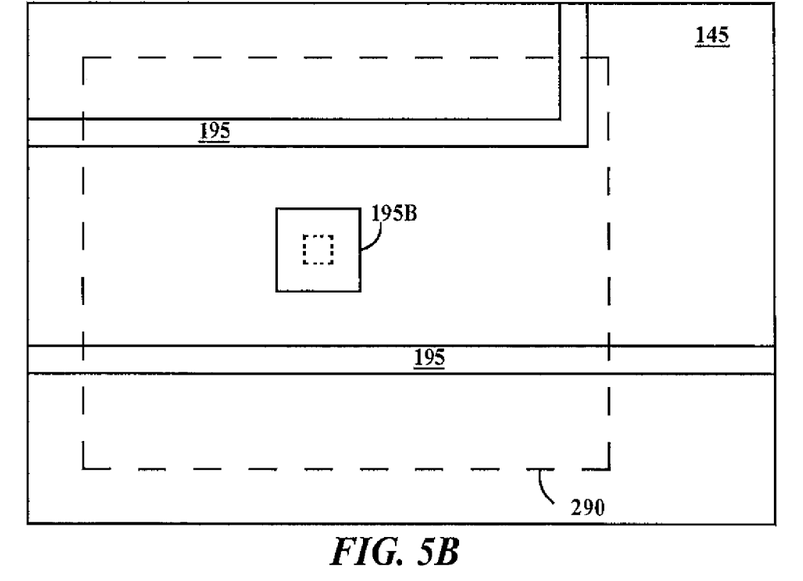
FIGS. 5B and 5C are exemplary plan views of a wiring level under monitor solder bumps according to embodiments of the present invention.
Figure 5C:
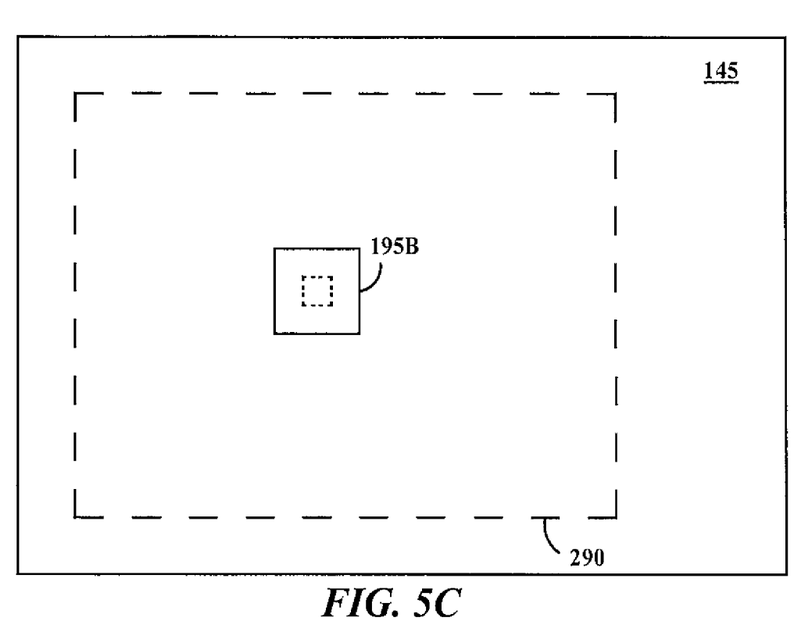

FIGS. 5B and 5C are exemplary plan views of a wiring level under monitor solder bumps according to embodiments of the present invention. In FIG. 5B, ULK ILD layer 145 of FIG. 4 is illustrated respectively by way of example. FIG. 5B is similar to FIG. 5A except only two wires 195 pass through region 290 and wire 195B is present. In FIG. 5B, the conductor density in region 290 is about 17% including monitor wire 195B though FIG. 5B is not in scale and region 290 has at least 10 times the area shown. At a truer scale, keeping two wires 195 and monitor wire 195B as shown, the conductor density would be about 2%. Thus, region 290 of FIG. 5B is weaker than region 290 of FIG. 5A.

In FIG. 5C, an ULK ILD layer 145 of FIG. 4 is illustrated by way of example. FIG. 5C is similar to FIG. 5A except there are no wires 195 in region 290 and only monitor wire 195B is present in region 290. In FIG. 5C, the conductor density in region 290 is about 3% including monitor wire 195B though FIG. 5C is not in scale and region 290 has at least 10 times the area shown. At a truer scale, the conductor density would be about 0.3%. Thus, region 290 of FIG. 5C is very much weaker than both region 290 of FIG. 5A and region 290 of FIG. 5B.

The three ULK ILD layers 140, 145 and 150 illustrated in FIG. 4, each contain a portion of a monitor structure and have a wire under solder bump 240A and have a area or volume conductor density of less than a minimum density (e.g., about 20% of the area or volume of the region is conductor). However, as few as one of the ULK ILD layers can contain a portion of a monitor structure and as few as one of the ULK layers can have a conductor density that is less than the minimum density but they must be the same layer. The more ULK ILD layers having a conductor density of less than the minimum density the weaker the monitor solder bump will be, so it is preferred that multiple ULK ILD layers have conductor densities of less than the minimum density.

FIG. 6 is a cross section view of the integrated circuit of FIG. 4, mounted to an exemplary module illustrating a stress induced separation failure. FIG. 6 is similar to FIG. 4 except chip 100A has been mounted to module 245. Module 245 includes a module pad 285 connected to an I/O wire 265 (or alternatively to a power wire 267 or a ground wire 268) and ground plane 255. Optional silicon oxide filled epoxy 254 is also illustrated. Because of the thermal coefficient of expansion mismatch between module 245 and chip 100 a separation 295 has been formed in ULK ILD layers 140, 145 and 150 after cool down from the chip attach solder reflow process. Separation 295 has disrupted the connection between wire 185B and 205B yielding either an open circuit or a high resistance circuit that may be detected by the circuit of FIG. 8.

FIG. 7 is a cross section view the integrated circuit of FIG. 4, mounted to an exemplary stress inducing module illustrating a stress induced separation failure. FIG. 7 is similar to FIG. 6 except chip 100A has been mounted to module 245A. Module 245A is similar to module 245 of FIG. 6 except module 245A includes a non-functional (i.e., is not necessary for the operation of integrated circuit chip 100A) stiffening plate 300 that aligns over module solder bump 240A. This increases the stress on ULK ILD layers 140, 145 and 150 generated by the thermal coefficient of expansion mismatch between module 245 and chip 100. The increased stress makes separation 295 more likely to be formed. Separation 295 has disrupted the connection between wire 195B and 200B yielding either an open circuit or a high resistance circuit that may be detected by the circuit of FIG. 8. Stiffening plate 300 may comprise metal, copper, plastic or carbon fiber. In one example, stiffening plate 300 is connected to ground. In one example, stiffening plate 300 is not connected to ground, power, or any wires of module 245A.

It should be understood that the presence or absence of monitor structures in ULK ILD layers 140, 145 and 150 does not cause a separation to be formed in one of the ULK ILD layers. It should also be understood that the conductor density of one or more ULK ILD layers 140, 145 and 150 being less than the minimum density does not cause a separation to be formed in one or more of the ULK ILD layers, but only makes it more likely that should the stress induced by the CTE mismatch between the chip and the module be transmitted through the solder bump, that the stress will cause separations and that those separations will be formed at least under monitor solder bumps if not under normal solder bump pads. Therefore, if no separations are detected by the monitor circuits attached to the monitor structures under the monitor solder bumps, it is highly probable that there are no separations in the ULK ILD layers under normal solder bump and the module may be passed. Likewise, if separations are detected by the monitor circuits attached to the monitor structures under the monitor solder bumps, it is possible that there are separations in the ULK ILD layers under normal solder bump and the module may be failed or sent for further testing.

The test methodology would be (1) after mounting chip on module, screen test for separations under monitor solder bumps using monitor structures and circuits according to embodiments of the present invention; (2) if the module passes the screening, pass the module for white bumps and continue to other tests (e.g., functional or reliability tests); (3) if the module fails the screening, either (5) fail the module and terminate testing or (6) perform a test for separations under normal solder bumps. If the module passes the test in (6), then (7) pass the module for white bumps and then continue to other tests.

Figure 8:
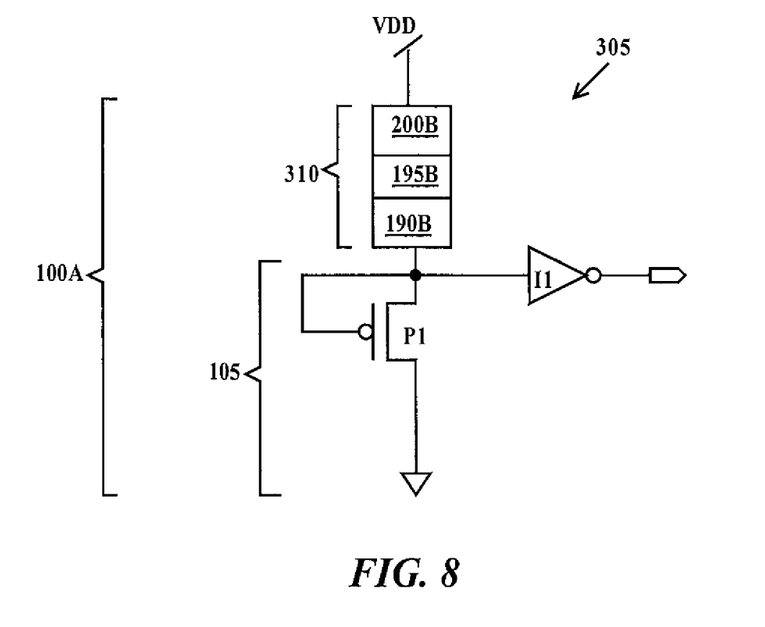
FIG. 8 is a diagram illustrating an exemplary monitor circuit for monitoring the monitor structure of FIGS. 4, 6 and 7.

FIG. 8 is a diagram illustrating an exemplary monitor circuit for monitoring the monitor structure of FIGS. 4, 6 and 7. In FIG. 8, a test circuit 305 includes a PFET P1, an inverter I1 and a monitor structure 310 comprising wires 190B, 195B and 200B. Turning to FIG. 4 (or FIG. 6 or FIG. 7), wire 200B is connected through solder bump 240A of chip 100A by wires 205A, 210A, pad 215 and BLM 235 and wire 190B is connected to the source of PFET P1 (formed in substrate 105) by wires 185A, 180A, 175A, 170A, and 165A. Returning to FIG. 8, the source of PFET P1 is also connected to the gate of PFET P1 and the input of inverter I1. The drain of PFET P1 is connected to ground. When no separation is present in monitor structure 310 a logical 0 will be presented on the output of inverter I1. When a separation is present in monitor structure 310 (essentially causing an open circuit), a logical 1 will be presented on the output of inverter I1. Monitor circuit 305 is essentially a continuity checker. However, one of ordinary skill in the art could devise a circuit that would measure current flow through monitor structure 310 or the resistance of monitor structure 310. It should also be understood that the VDD and ground connections may be reversed and the PFET replaced by an NFET.

Figure 9:
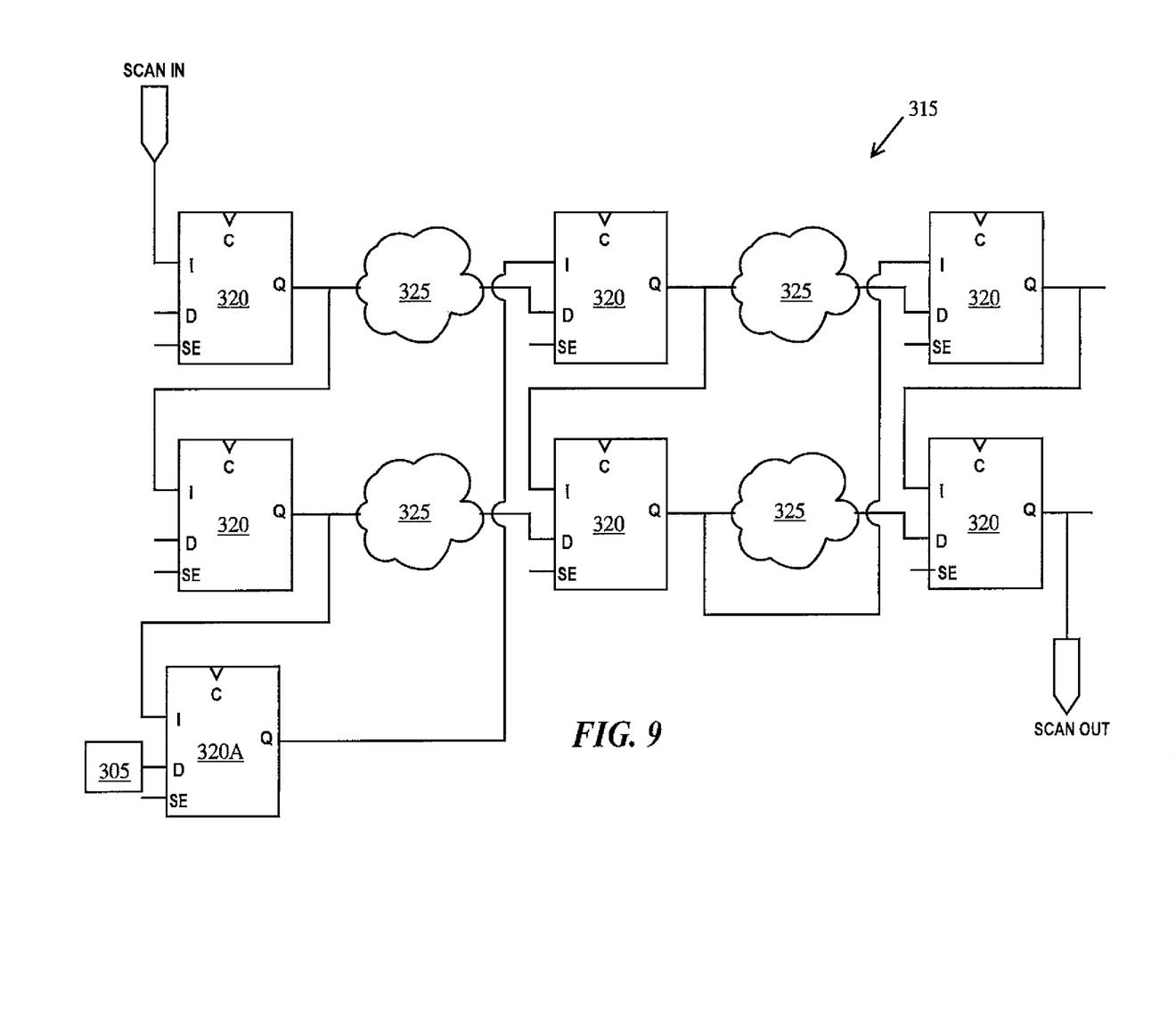
FIG. 9 is a circuit diagram of an exemplary scan chain of an integrated circuit chip.

FIG. 9 is a circuit diagram of an exemplary scan chain of an integrated circuit chip. In FIG. 9, the output of test circuit 305 is connected to a latch 320A of a scan chain 315. Scan chain 315 comprises a serially (Q to I) connected set of latches 320 and latch 320A that provide input data (D) to logic circuits 315 and receive output data (Q) from the logic circuits except for latch 320A. Because latch 320 is connected to monitor structure 305, latch 320A is not connected to any functional logic circuit 325. Each latch 320 and latch 320A has a scan enable (SE) pin. Scan chains are well-known in the art and the novel feature is injecting solder bump monitor data into the scan out data pattern.

Figure 10:
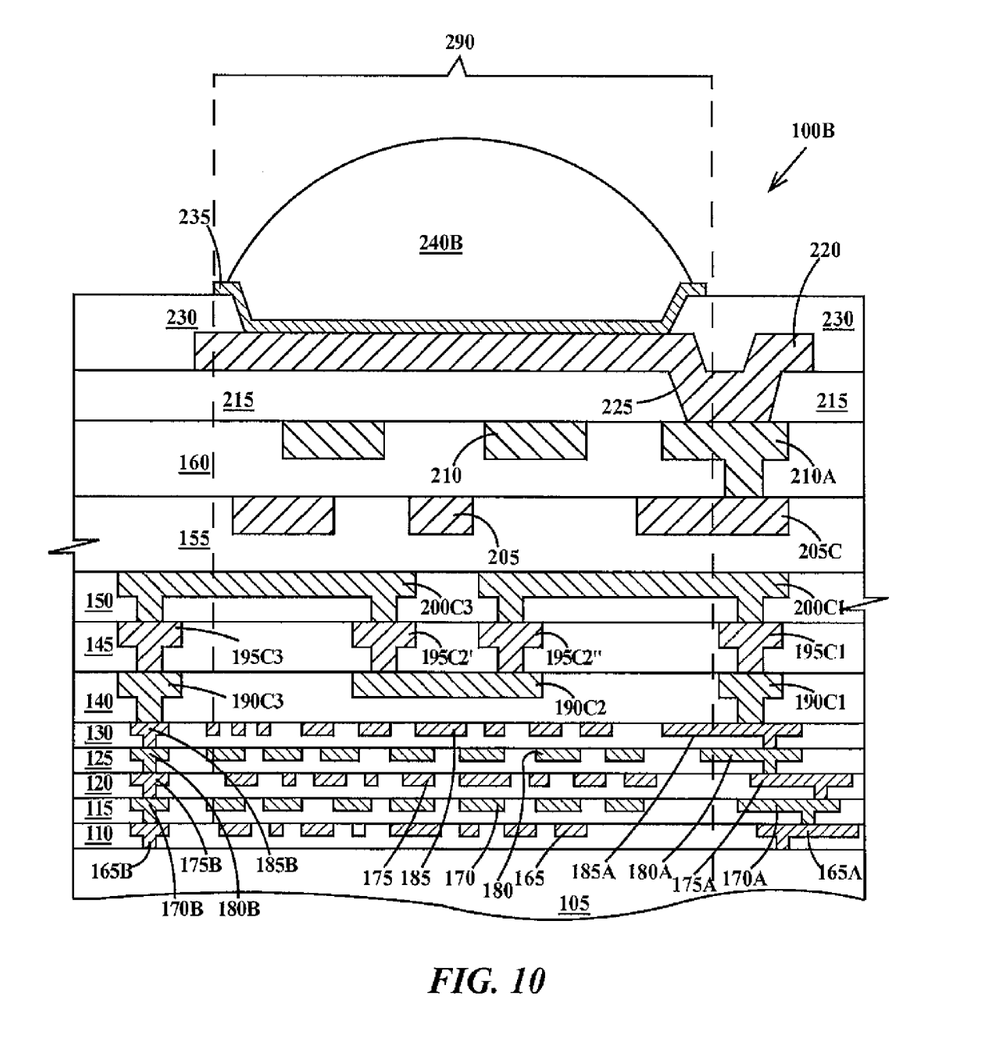
FIG. 10 is an exemplary cross section view of the wiring levels of an integrated circuit chip under an alternative monitor solder bump illustrating a monitor structure according to an embodiment of the present invention.
Figure 12:
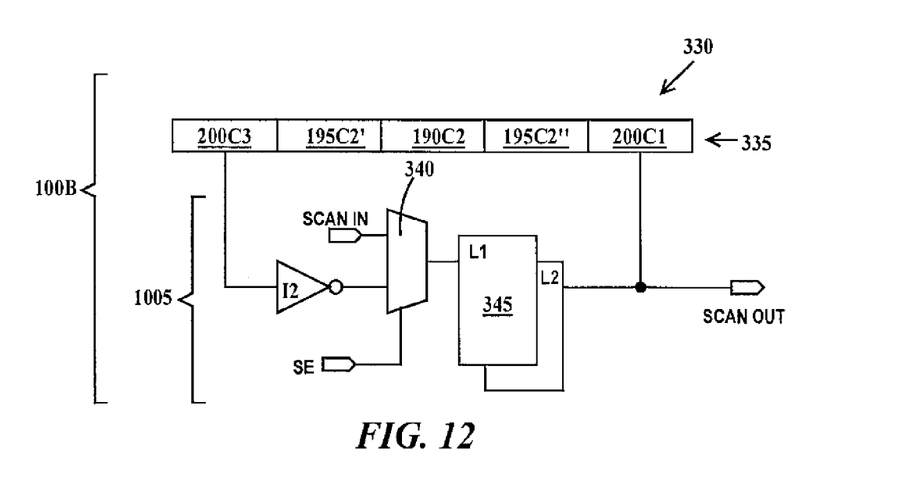
FIG. 12 is a diagram illustrating an exemplary monitor circuit for monitoring the monitor structure of FIG. 11.

FIG. 10 is an exemplary cross section view of the wiring levels of an integrated circuit chip under an alternative monitor solder bump illustrating a monitor structure according to an embodiment of the present invention. In FIG. 10, an integrated circuit chip 100B is similar to integrated circuit chip 100A of FIG. 4 except ILD layers 110, 115, 120, 125 and 130 include respective wires 165B, 170B, 175B, 180B and 185B; ULK ILD layer 140 includes wires 190C1, 190C2 and 190C3; ULK ILD layer 145 includes wires 195C1, 995C2', wire 195C2" and wire 195C3; ULK ILD layer 150 includes wires 200C1 and 200C3; and ILD layer has wire 205C replacing wire 205A. Wires 200C1, 195C2", 190C2, 195C2', 200C3 form a monitor structure. There is thus formed an electrical loop from first devices (not shown) in substrate 105 through wires 165A, 170A, 175A, 180A, 185A, 190C1, 195C1, 200C1, 195C2", 190C2, 195C2', 200C3, 195C3, 190C3, 185B, 180B, 175B, 170B and 165B back to second devices (not shown) in substrate 105. Wires 165A and 165B connect to different devices in substrate 105 as shown in FIG. 12. Again, wires 200C1, 195C2", 190C2, 195C2', 200C3 form a vertical monitor structure that will be damaged by horizontal separations in the ULK ILD layers. Solder bump 240B is designated a monitor solder bump because of (i) the presence of the monitor structure comprising wires 190C1, 195C2", 190C2, 195C2', 200C3 in region 290 and (ii) because the lower conductor density (in FIG. 10, wires) in at least one of ULK ILD layers 140, 145 and 150 compared to the conductor density under in those same layers under a normal solder bump in a similar region 290.

Figure 11:
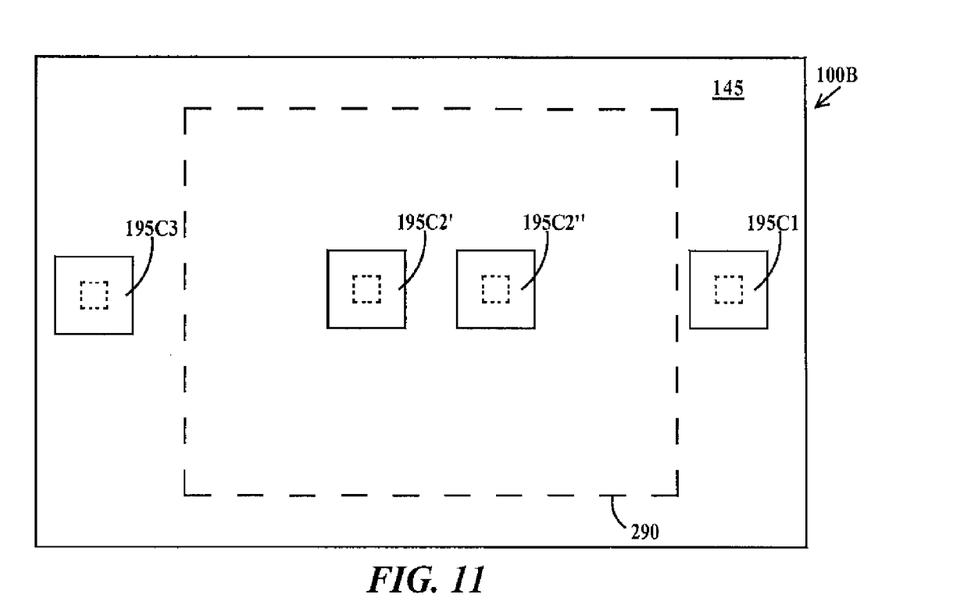
FIG. 11 is an exemplary plan view of a wiring level of FIG. 10 under a monitor solder bump according to embodiments of the present invention.

FIG. 11 is an exemplary plan view of a wiring level of FIG. 10 under a monitor solder bump according to embodiments of the present invention. In FIG. 11, ULK ILD layer 145 of FIG. 4 is illustrated respectively by way of example. In FIG. 11, the conductor density in region 290 is about 6% including monitor wires 195C2' and 195C2" though FIG. 11 is not in scale and region 290 has at least 10 times the area shown. At a truer scale, keeping two monitor wires 195C2' and 195C2" as shown, the conductor density would be about 0.6%.

FIG. 12 is a diagram illustrating an exemplary monitor circuit for monitoring the monitor structure of FIG. 11. In FIG. 12, a test circuit 330 includes a monitor structure 335 comprising wires 190C1, 195C2", 190C2, 195C2', 200C3; a multiplexer 340; a latch 345; and an inverter I2. Turning to FIG. 11, wire 200C1 is connected through wires 195C1, 190C1, 185A, 180A, 175A, 170A and 165A to the L2 output of latch 345 and a scan out pin and wire 200C3 is connected the input of inverter I2 by wires 195C3, 190C3, 185B, 180B, 175B, 170B, and 165B. Returning to FIG. 12, the output of inverter I2 is connected to a first input of multiplexer 340, a scan in pin is connected to a second input of multiplexer 340, and the output of multiplexer 340 is connected to the L1 input of latch 345. When no separation is present in monitor structure 335, the value on the scan out pin will be presented to the input of inverter I2. When a separation is present in monitor structure 335 (essentially causing an open circuit), the value on the scan out pin will not be presented to the input of inverter I2. Monitor circuit 335 is essentially a continuity checker. However, one of ordinary skill in the art could devise a circuit that would measure current flow through monitor structure 335 or the resistance of monitor structure 335. It should also be understood that the scan in pin and scan out pins would be connected to a scan chain similar to that illustrated in FIG. 9.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An integrated circuit, comprising:
an integrated circuit chip comprising a semiconductor substrate and an array of solder bumps, said array of solder bumps comprising a monitor solder bump and normal solder bumps;
a stack of interlevel dielectric layers between said substrate and said array of solder bumps;
two or more ultra-low K layers of said interlevel dielectric layers, each of said two or more ultra-low K layers comprising an ultra-low K layer having a dielectric constant of 2.4 or less;
a dielectric structure failure monitor in a region directly under said monitor solder bump, said dielectric structure failure monitor comprising physically abutting and electrically conductive conductors embedded in said two or more ultra-low K layers, said dielectric structure failure monitor extending vertically through said two or more ultra-low K layers; and
wherein the conductor density in at least one ultra-low K layer of said two or more ultra-low K layers in said region directly under said monitor solder bumps is less than the conductor density in corresponding regions of each layer of said two or more ultra-low K layers directly under each normal solder bump of a plurality of said normal solder bumps.

2. The integrated circuit of claim 1, wherein the conductor density in at least one ultra-low K layer of said two or more ultra-low K layers in said region directly under said monitor solder bumps is less than a specified minimum density and the conductor density in corresponding regions of each layer of said two or more ultra-low K layers directly under each normal solder bump of a plurality of said normal solder bumps is greater than a specified minimum density.

3. The integrated circuit of claim 1, wherein said two or more ultra-low K layers have a modulus of elasticity of about of about 5 GPa or less.

4. The integrated circuit of claim 1, wherein said dielectric structure failure monitor is electrically connected to said monitor solder bump by respective wires in interlevel dielectric layers above said two or more ultra-low K layers and electrically connected to a monitor circuit having transistors formed in said substrate by respective wires in interlevel dielectric layers below said two or more ultra-low K layers.

5. The integrated circuit of claim 1, wherein said monitor solder bump is connected to a positive or negative terminal of a power supply.

6. The integrated circuit of claim 1, wherein said dielectric structure failure monitor is not electrically connected to said monitor solder bump.

7. The integrated circuit of claim 1, wherein a first portion of said dielectric structure failure monitor is electrically connected to a first input of a monitor circuit comprising transistors by a first set of respective wires in interlevel dielectric layers below said two or more ultra-low K layers and a second portion of said dielectric structure failure monitor is electrically connected to a second input of a monitor circuit comprising transistors by a second and different set of respective wires of the same interlevel dielectric layers below said two or more ultra-low K layers.

8. The integrated circuit of claim 1, wherein said dielectric structure failure monitor forms a continuous electrical path in said two or more ultra-low K layers and is configured to be broken by separations in said two or more ultra-low K layers or by delaminations between layers of said stack of at least two ultra-low K layers.

9. The integrated circuit of claim 1, further including:
a module electrically and physically connected to said integrated circuit chip by said array of solder bumps.

10. The integrated circuit of claim 9, wherein said module includes ground planes, power planes, ground wires, power wires and input/output wires and further includes a non-functional stiffening plate directly over only said monitor solder bump.

11. The integrated circuit of claim 4, further including:
said monitor circuit electrically connected to a latch of a scan chain of said integrated circuit.

12. The integrated circuit of claim 2, wherein said specified minimum density is an area density of about 20% or a volume density of about 20%.

13. The integrated circuit of claim 1, wherein said stack of interlevel dielectric layers include one or more low-k dielectric layers, said one or more low-k dielectric layers between said two or more ultra-low k layers and said semiconductor substrate.

14. The integrated circuit of claim 1, wherein said conductors embedded in said two or more ultra-low K layers are dual-damascene wires.

15. The integrated circuit of claim 1, wherein a bottom surface of a first layer of said two or more ultra-low k layers is in physical contact with a top surface of a second layer of said two or more ultra-low k layers.

16. The integrated circuit of claim 1, wherein said stack of interlevel dielectric layers include:
one or more low-k dielectric layers having a dielectric constant between 2.4 and 3, said one or more low-k dielectric layers between said two or more ultra-low k layers and said semiconductor substrate; and
one or more dielectric layers having a dielectric constant greater than 3, said one or more dielectric layers between said two or more ultra-low k layers and said monitor bump.

17. The integrated circuit of claim 1, wherein said stack of interlevel dielectric layers include:
one or more tetraethoxysilane (TEOS) oxide layers, said one or more TEOS oxide layers between said two or more ultra-low k layers and said semiconductor substrate; and
one or more octametylcyclotetrailoxane (OMCTS) layers, said one or more OMCTS layers between said two or more ultra-low k layers and said array or solder bumps.

18. The integrated circuit of claim 1, wherein said monitor solder bump is not connected to functional circuits of said integrated circuit chip.

19. The integrated circuit of claim 1, wherein said dielectric structure failure monitor is the only conductive structure in two or more ultra-low K layers in said region directly under said monitor solder bump.

* * * * *